(12) United States Patent
Sousa et al.

(10) Patent No.: US 8,581,573 B2
(45) Date of Patent: Nov. 12, 2013

(54) CIRCUIT FOR MEASURING THE EFFECTIVE CURRENT OF A SIGNAL TO BE MONITORED

(75) Inventors: Luis De Sousa, Maisons Laffitte (FR); Dominique Dupuis, Bruyeres sur Oise (FR)

(73) Assignee: Valeo Systemes de Controle Moteur, Cergy-Pontoise (FR)

( * ) Notice: Subject to any disclaimer, the term of this patent is extended or adjusted under 35 U.S.C. 154(b) by 241 days.

(21) Appl. No.: 13/127,327

(22) PCT Filed: Nov. 5, 2009

(86) PCT No.: PCT/EP2009/064705
§ 371 (c)(1),
(2), (4) Date: Jun. 13, 2011

(87) PCT Pub. No.: WO2010/052278
PCT Pub. Date: May 14, 2010

(65) Prior Publication Data
US 2011/0234205 A1 Sep. 29, 2011

(30) Foreign Application Priority Data
Nov. 6, 2008 (FR) ..................................... 08 06210

(51) Int. Cl.
*G01R 19/00* (2006.01)
(52) U.S. Cl.
USPC ....................... 324/123 R; 324/76.11; 363/80

(58) Field of Classification Search
None
See application file for complete search history.

(56) References Cited

U.S. PATENT DOCUMENTS

| | | | |
|---|---|---|---|
| 3,624,525 A | 11/1971 | Smith | |
| 3,911,359 A | 10/1975 | Metcalf | |
| 5,027,060 A | 6/1991 | Fraisse | |
| 6,204,719 B1 | 3/2001 | Gilbert | |
| 6,359,576 B1 | 3/2002 | Petrofsky | |
| 6,429,720 B1 | 8/2002 | Gilbert | |
| 7,002,394 B1 | 2/2006 | Gilbert | |
| 7,202,637 B2 * | 4/2007 | Green et al. | 322/7 |
| 2007/0024265 A1 | 2/2007 | Higgins | |

FOREIGN PATENT DOCUMENTS

DE 31 50 006 A1 6/1983
WO 95/05023 A1 2/1995

OTHER PUBLICATIONS

International Search Report w/translation from PCT/EP2009/064705 dated Feb. 11, 2010 (4 pages).

* cited by examiner

*Primary Examiner* — Jeremele M Hollington
*Assistant Examiner* — Trung Nguyen
(74) *Attorney, Agent, or Firm* — Osha Liang LLP

(57) ABSTRACT

The present invention relates to a circuit for measuring an effective current ($i_{eff}(t)$) of a signal to be monitored (i(t)), where the circuit includes means for making a continuous reference signal ($i_{DC}(t)$) depend on the signal to be monitored (i(t)) so that the effective current ($i_{DC}eff(t)$) of the continuous reference signal (iDC(t)) is equal to the effective current ($i_{eff}(t)$) of the signal to be monitored (i(t)).

8 Claims, 2 Drawing Sheets

CIRCUIT FOR MEASURING THE EFFECTIVE CURRENT OF A SIGNAL TO BE MONITORED

The present invention relates to a circuit for measuring the effective current of a signal to be monitored, in particular in the field of the monitoring of the current of variable-inductance electric machines such as actuators used for so-called electromagnetic valves ("camless" system) in motor vehicles. Those skilled in the art will appreciate that effective current is calculated as root mean square (RMS) value.

More generally, the invention relates to any item of equipment requiring one or more simultaneous measurements of a true effective quantity, in particular an effective current, for supervision, diagnosis or close protection, in relation to equipment within which no numerical resources or calculational power are available or sufficient to process the measurement, and into which the introduction of expensive analog components, such as analog multipliers or other uncommon specific integrated circuits, is not desired.

The invention is particularly beneficial in respect of reliable diagnosis of an overload in particular in respect of an optimized electromagnetic valve system for which there is a desire to utilize the maximum of capabilities without exceeding the operating limits.

Indeed, equipment supplying a load with heavy current must be monitored so as in particular to ensure the safety of people and of hardware, optimize the consumption of the loads, detect a possible anomaly of these loads (overload) and/or adapt the protection thresholds as a function of external and/or variable parameters such as temperature, starting mode or a particular configuration of the item of equipment.

In the case of a linear load, whether the current is AC or DC, it suffices to measure the peak current, the mean current or the mean rectified current to obtain an indirect measurement of the effective current.

In fact, there exists a direct link between the measured quantity on the one hand and the consumption of the system or the warming of the components which conduct the current. It is then unnecessary to perform a measurement of the effective current.

However, when the load is non-linear and the shape factor of the current is small and time-varying, the measurements of peak current, of mean current or of mean rectified current are no longer indicative of the effective current.

By considering for example the pulsating current represented in FIG. 1, the ratio between a mean measurement $I_{mean}$ and an effective measurement $I_{effective}$ is the square root of the duty ratio, the latter being defined as the ratio of the duration $t_1$ of the signal to its period $T$.

According to an example specific to the automotive sector, $$I_{effective} = \sqrt{\frac{1}{T}\int_0^T i^2(t)\,dt} = I * \sqrt{\frac{t_1}{T}}$$

$$I_{mean} = \frac{1}{T}\int_0^T i(t)\,dt = I * \frac{t_1}{T}$$

$$\frac{I_{mean}}{I_{effective}} = \sqrt{\frac{t_1}{T}} = 0.3 \text{ (.with } t_1 = 7.2 \text{ ms and } T = 80 \text{ ms)}$$

This situation occurs in an electromagnetic valve control, where the actuators of valves consume a pulsating current whose frequency is adapted to the engine speed. Thus, the width of the pulses varies little, in contradistinction to their period, so that the mean of such a signal is constant whereas its effective current is not.

In this typical case, neither the peak value nor the mean value may represent the warming of the actuator, of the power supply cables or of any other component conducting the current.

The existing solutions provided by the prior art are mainly of five types:
 approximation of the value of the effective current by combining the peak value and the mean value:

Such a scheme is described, for example, in patent application WO9505023 "METHOD AND APPARATUS FOR RMS CURRENT APPROXIMATION".

This scheme is limited by the signal's harmonic distortion rate. Moreover, this scheme is very sensitive to exterior disturbances and to the various types of control, thus reducing its reproducibility.

In particular, this scheme cannot be improved by a correction factor such as proposed by U.S. Pat. No. 5,027,060 "MEASURING DEVICE OF THE RMS VALUE OF A SIGNAL, NOTABLY FOR CURRENT MEASUREMENT IN A SOLID-STATE TRIP DEVICE".

deduction of the value of the effective current by a numerical calculation:

The measurement of the effective current may be obtained by numerical calculations based on analog-digital acquisitions which require a passband and a sampling frequency that are large enough not to excessively filter the processed signals.

Therefore, these calculations may monopolize significant numerical resources, in particular in terms of calculation power, all the more important the higher the number of measurements of current to be monitored and the more significant the harmonic rate. This solution therefore exhibits a high cost.

deduction of the value of the effective current by an analog calculation:

So as not to monopolize calculational resources, it is possible to resort to analog circuits.

Various analog devices which make it possible to carry out the necessary calculations to obtain the root mean square (RMS) value, in particular multiplication and the square root function, exist on the market. With the aid of analog devices such as these, it is possible to obtain a value of the square of the RMS value of a signal.

It is also possible to associate this measurement of the square of the RMS value with a function intended to extract therefrom its square root and thus tend to the value of the effective measurement. Such is the case in particular for solutions based on Gilbert cells, such as that proposed by U.S. Pat. No. 7,002,394 "LOW SUPPLY CURRENT RMS-TO-DC CONVERTER".

But when it is necessary to perform the measurement on a large number of pathways, as in the case of an electronic control circuit for 8 or 16 electromagnetic valves, the cost of the function becomes high as in the previous scheme.

Furthermore, measurement of the square of the RMS value does not make it possible to have good sensitivity over a wide scale of value, the relative error and the resolution of the measurements varying inversely with the measured square.

the use of the thermal effect:

The power dissipated being proportional to the square of the effective current, it is possible to find the value of the effective current by slaving the temperature rise of a resistor traversed by a stabilized DC current to that of a resistor traversed by a current which is the image of the measured current.

Such solutions are disclosed in U.S. Pat. No. 3,911,359 and U.S. Pat. No. 3,624,525 "TRUE RMS CONVERTER" as well as in patent US2007024265 "SYSTEMS AND METHODS FOR MEASURING AN RMS VOLTAGE."

But this technique is very tricky to implement since it is necessary to guarantee symmetry of the thermal impedances as well as insulation against the surrounding heat so as not to disturb the measurement. Moreover, the integration time of this circuit is difficult to adjust and the thermal time constants limit the reactivity of the setup.

tripping the current:

The current-tripping solutions generally used are fuses and electro-magneto-thermal trips.

These solutions have numerous defects: the tolerance on the threshold is wide and sensitive to temperature, an external intervention is necessary in order to replace the fuse or reset the trip, the space required is significant and the tripping thresholds or the triggering times are not adjustable in real time.

In this context, the present invention is aimed at providing a circuit for measuring effective current of a signal to be monitored exhibiting low cost and satisfactory reliability for an application such as the monitoring of the supply current for electromagnetic valves of an automobile engine.

To this end, the invention proposes a circuit for measuring the effective current of a signal to be monitored, characterized in that it comprises means for slaving a DC reference signal to the signal to be monitored in such a way that the effective current of the DC reference signal is equal to the effective current of the signal to be monitored.

A measurement circuit in accordance with the invention exhibits in particular the following advantages:

- its cost is reduced having regard to the fact that it may be implemented with very inexpensive electronic circuits, in an analog manner and while avoiding recourse to numerical calculations.

Moreover, a circuit in accordance with the invention may be implemented by means of low-cost components, such as standard operational amplifiers. It does not therefore require analog multipliers or specific integrated circuits.

- Its use implements a DC signal whose voltage or intensity are readily measurable.
- Its passband is limited only by the chopping frequency and by the speediness of the components, such as operational amplifiers, which are used. Thus, it is possible to adapt this passband to the desired cost/performance ratio for the circuit.
- Its time constant is adjustable, thereby making it possible, again, to adapt this parameter to the desired cost/performance ratio.
- Its implementation does not eliminate any of the harmonics included in the passband, thereby precluding any excessive filtering of the current to be monitored.
- Its measurement of the signal to be monitored is performed by way of a measurement proportional to the square of the effective current, thereby allowing sensitive measurements even for low values of this effective current.
- Its passband is adjustable. Within the framework of effective-current tripping, this solution offers the possibility of adjusting the tripping threshold in real time.

A circuit according to the invention can also exhibit one or more of the characteristics hereinbelow, considered individually or according to all the technically possible combinations:

In one embodiment, the circuit comprises a first modulator and a second modulator processing, respectively, the signal to be monitored or the reference signal so as to provide a first modulated signal or a second modulated signal whose mean current is proportional, respectively, to the square of the effective current of the signal to be measured or to the square of the effective current of the reference signal.

According to one embodiment, the circuit comprises means for modulating the first modulated signal and the second modulated signal by pulse width and amplitude modulation with the aid of a periodic signal.

In one embodiment, the first modulator comprises means so that the pulse width modulation corresponds to a duty ratio proportional to the intensity of the current to be monitored.

According to one embodiment, the circuit comprises means for modulating the signal to be monitored and the DC reference signal with a chopping frequency such that, over a period T of calculation of the mean value of the first modulated signal or of the second modulated signal, this mean value is proportional to the square of the effective current of the signal to be measured or of the reference signal.

In one embodiment, each modulator comprises an operational amplifier receiving, at a first input, a signal to be modulated and, at a second input, the periodic signal.

According to one embodiment, the circuit comprises:

- a block performing the comparison between the effective currents of the modulated signals via their respective mean value, and
- a block feeding the result of this comparison into the circuit, via a feedback loop, as being the DC reference signal.

The invention also relates to a method for measuring the effective current of a signal to be monitored, characterized in that a DC reference signal is slaved to the signal to be monitored in such a way that the effective current of the DC reference signal is equal to the effective current of the signal to be monitored by means of a circuit in accordance with one of the previous embodiments.

In one embodiment, the supply current for an electromagnetic valve actuator of a motor vehicle is measured.

Other characteristics and advantages of the invention will emerge clearly from the description which is given hereinbelow, by way of nonlimiting indication, of an embodiment of the invention given with reference to the appended figures, among which:

FIG. 1, already described, illustrates a pulsating current,

In all the figures, the common elements bear the same reference numbers.

According to the invention, a circuit for measuring the effective current of a signal to be monitored $i(t)$ comprises means for slaving a DC reference signal $i_{DC}(t)$ to this signal $i(t)$ to be monitored so that the effective current $i_{DCeff}(t)$ of this reference signal $i_{DC}(t)$ is equal to the effective current $i_{eff}(t)$ of the signal to be monitored.

To perform this slaving, a circuit in accordance with the invention can implement a double modulation function applied both to the signal $i(t)$ to be monitored and to the reference signal $i_{DC}(t)$.

This double modulation, similar for the two signals, is described hereinbelow in relation to the signal i(t) to be monitored. It comprises in particular:

a first pulse width modulation such that the duty ratio •(t), that is to say the width of a pulse at the instant t, of the modulated signal u(t) is proportional to the intensity of the current to be measured i(t) according to the formula:

•(t)=K*i(t)

where K is a constant.

a second amplitude modulation such that the amplitude of the modulated signal u(t) is proportional to the intensity of the current to be measured i(t).

Figure 1:
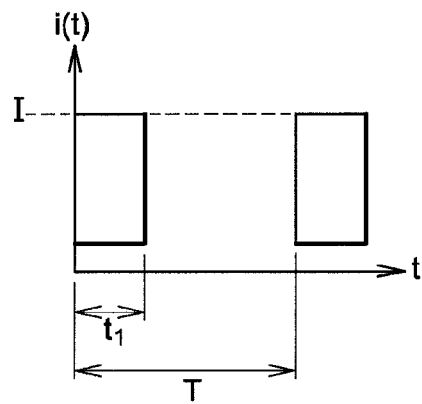
Figure 2:
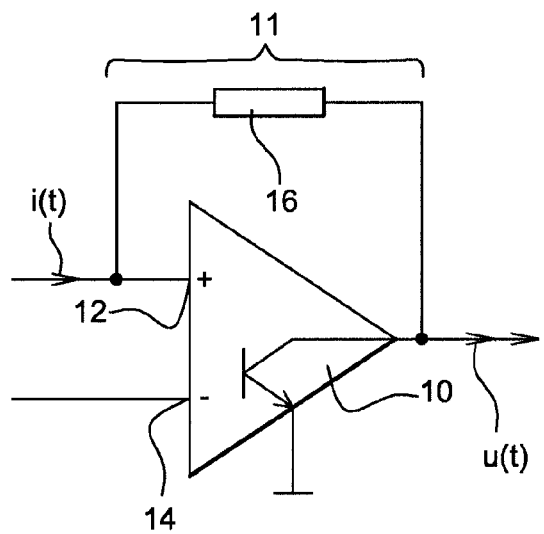
FIG. 2 represents a comparator circuit implemented for modulating a signal according to one embodiment of the invention.

In a practical manner, this pulse width and amplitude double modulation may be carried out by means of a modulator 11 (FIG. 2) comprising an operational amplifier 10. For this purpose, the signal i(t) to be monitored is provided at the V+ input (12) of the operational amplifier 10 while a periodic signal, typically a sawtooth signal, is provided at the V− input (14) of this same operational amplifier 10.

A pull-up resistor 16 imposes the voltage of the signal i(t) when the voltage at the V+ terminal (12) is greater than the voltage at the V− terminal (14) of the amplifier 10. If appropriate, this voltage is zero.

Figure 3:
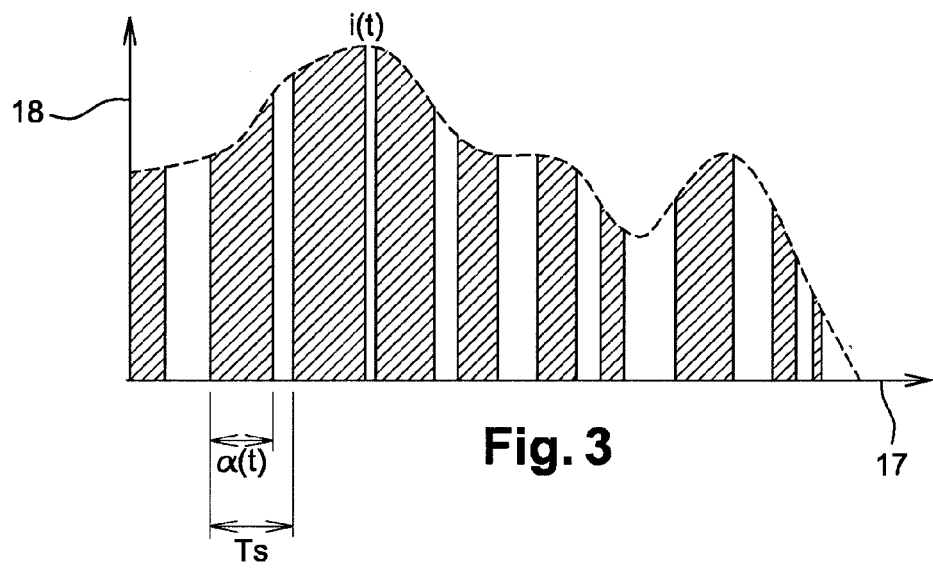
FIG. 3 represents a doubly modulated signal, by pulse width and amplitude modulation, according to one embodiment of the invention.

The shape of the signal u(t) resulting from such a double modulation is illustrated in FIG. 3 which represents, as a function of time—abscissa axis 17—the intensity of this signal u(t)—ordinate axis 18.

By virtue of this double modulation, a signal u(t) is obtained whose mean value may, in practice, be proportional to its effective intensity $i_{eff}(t)$.

Indeed, by considering that the pulse period of the signal, also dubbed the chopping period, is large relative to an integration time T implemented to evaluate a mean value U(T) of this signal u(t), this mean value U(T) may be written in the following manner:

$$\frac{1}{T}\int_0^T u(t)\,dt \approx \frac{1}{T}\int_0^T i(t)*\alpha(t)\,dt = \frac{K}{T}\int_0^T i^2(t)\,dt = K \cdot i_{eff}^2.$$

Hereinafter, the mean value U(T) of this signal u(t) arising from the double modulation of the signal i(t) to be monitored may be compared with the mean value $U_{DC}(T)$ of the signal $U_{DC}(t)$ arising from the double modulation of the DC reference signal $i_{DC}(t)$.

Thus, it is possible to provide a slaving circuit supplied with the discrepancy between these two mean values U(T) and $U_{DC}(T)$ which tends to cancel out this discrepancy. Hence, the mean value U(T) of the modulated signal obtained on the basis of the current i(t) to be monitored tends to be identical to the mean value $U_{DC}(T)$ of the modulated signal obtained on the basis of the reference current $i_{DC}(t)$.

This equality may then be written, over this period T:

$$\int_0^T [U(t) - U_{DC}(t)]\,dt = 0$$

$$\Rightarrow \int_0^T U(t)\,dt = \int_0^T U_{DC}\,dt$$

$$\Rightarrow K(i_{measured})_{eff}^2 = K(i_{DC})_{eff}^2$$

$$\Rightarrow (i_{measured})_{eff} = (i_{DC})_{eff}$$

This equality thus conveys the function of the slaving circuit which tends to modify the reference signal $i_{DC}(t)$ toward a value such that its effective current $i_{DCeff}(t)$ is equal to the effective current $i_{eff}(t)$ of the signal to be monitored i(t).

Figure 4:
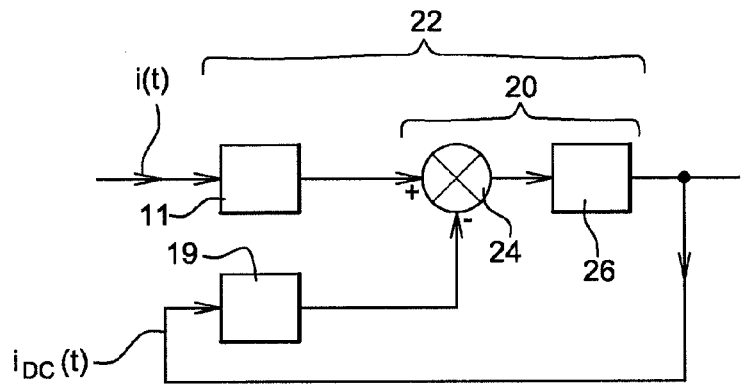
FIG. 4 is a functional diagram of a measurement circuit according to one embodiment of the invention.

With reference to FIG. 4, a circuit 22 in accordance with the invention thus comprises a loop 20 supplied with the output signal from a comparator 24 for slaving the respective mean values U(T) and $U_{DC}(T)$ of the signals u(t), modulated on the basis of the current to be measured i(t), and $u_{DC}(t)$, modulated on the basis of the reference current $i_{DC}(t)$.

After processing by an amplifier 26, this output signal is the DC reference signal $i_{DC}(t)$ transmitted to the input of the modulator 19, the manner of operation of which is similar to the manner of operation of the modulator 11 already described.

Figure 5:
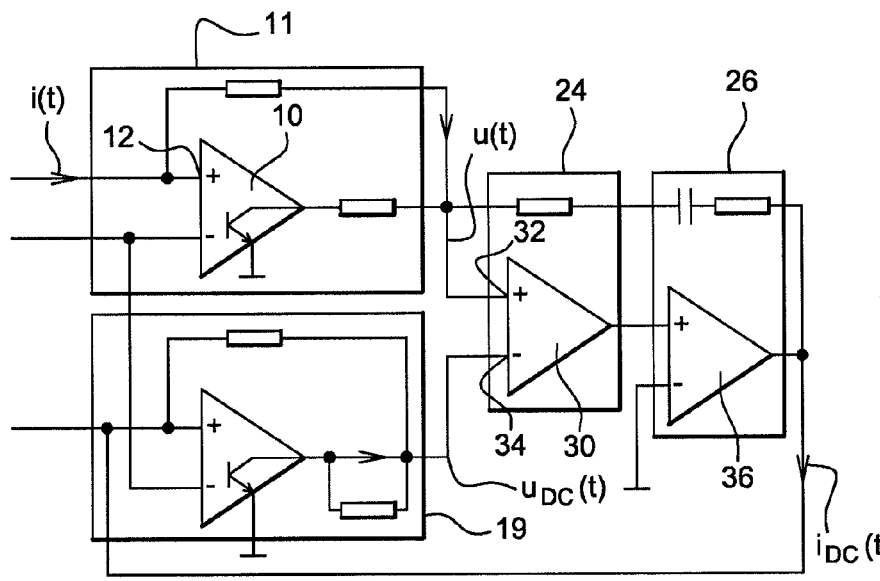
FIG. 5 represents operational amplifier and comparator circuits.

In practice, the circuit 22 can take the form of a circuit with operational amplifier illustrated in FIG. 5. More precisely, an operational amplifier 30 can perform the function of the comparator 24 by receiving, at its input 32, the signal u(t) modulated on the basis of the current to be measured and, at its input 34, the signal $u_{DC}(t)$ modulated on the basis of the reference current.

The loop 20 is implemented in the form of an integrator circuit with operational amplifier 36 which integrates the measured discrepancy and feeds it back into the circuit in the form of the DC reference signal.

Functionally, a circuit in accordance with the invention comprises in this embodiment four operational blocks, namely:

a block 11 performing the double modulation of the signal to be monitored i(t), a block 19 performing the double modulation of the reference signal $i_{DC}(t)$, a block 24 performing the comparison between the currents $i_{eff}(t)$ and $i_{DCeff}(t)$ and then averaging the result, a block 26 feeding the result of this comparison back into the setup as reference signal $i_{eff}(t)$.

Figure 6:
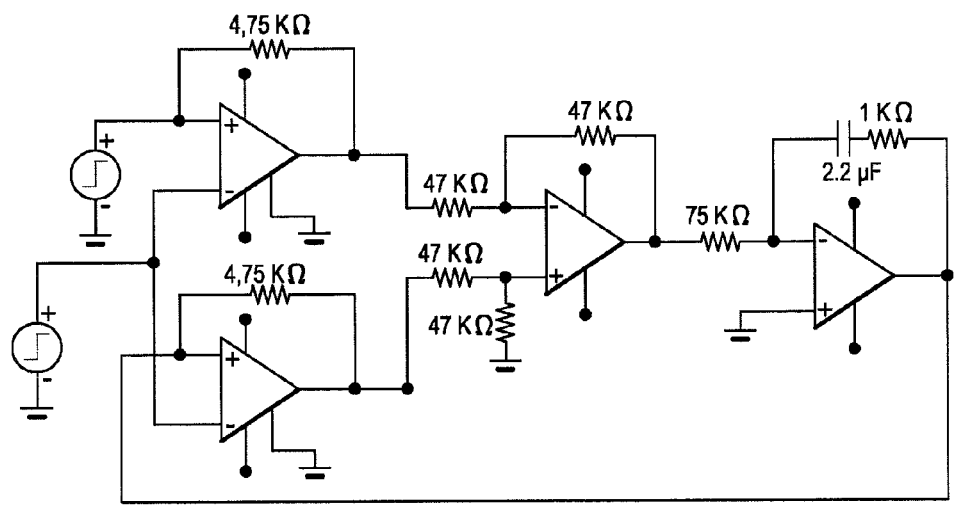
FIG. 6 is an electrical diagram making it possible to perform the functions described in FIG. 4.

By way of example, FIG. 6 represents the electrical diagram of a circuit in accordance with the invention. It should be noted that the components implemented—operational amplifier, comparator and resistors—exhibit a low cost and satisfactory reliability for the implementation of the invention.

It will also be noted that the invention has been more particularly described in the case of the use of amplifiers making it possible to carry out the functions described. However, other types of elements, in particular employing transistors, can also be used without departing from the scope of the invention. Finally, it will be possible to replace any means by an equivalent means.

The invention claimed is:

1. A circuit for measuring an effective current of a signal to be monitored, comprising:
   means for slaving a DC reference signal to the signal to be monitored so that an effective current of the DC reference signal is equal to the effective current of the signal to be monitored;
   a first modulator; and
   a second modulator,
   wherein the first and second modulators process, respectively, the signal to be monitored and the reference signal to obtain a first modulated signal or a second modulated signal whose mean current is proportional, respectively, to the square of the effective current of the signal to be monitored or to the square of the effective current of the reference signal.

2. The circuit as claimed in claim 1, wherein the first and the second modulators comprise means for modulating the first modulated signal or the second modulated signal by using a periodic signal to perform pulse width and amplitude modulation.

3. The circuit as claimed in claim 2, characterized in that the first (11) modulator comprises means so that the pulse width modulation of the first modulated signal (u(t)) corresponds to a duty ratio ($\alpha$) proportional to the intensity of the signal to be monitored (i(t)).

4. The circuit as claimed in claim 3, further comprising:
   means for modulating the signal to be monitored and the reference signal with a chopping frequency such that, over a period T of calculation of the mean value of the first modulated signal or of the second modulated signal, the mean value is proportional to the square of the effective current of the signal to be monitored or of the reference signal.

5. The circuit as claimed in claim 2, wherein each modulator comprises an operational amplifier receiving, at a first input, one of the signals to be processed and, at a second input, the periodic signal.

6. The circuit as claimed in claim 1, further comprising:
   a block performing the comparison between the effective currents of the processed signals via their respective mean value, and
   a block feeding the result of the comparison into the circuit, via a feedback loop, as reference signal for the circuit.

7. A method for measuring an effective current of a signal to be monitored, comprising:
   slaving a DC reference signal to the signal to be monitored so that an effective current of the DC reference signal is equal to the effective current of the signal to be monitored, wherein the DC reference signal is slaved using a circuit comprising means for performing such slaving;
   performing a first modulation; and
   performing a second modulation,
   wherein the first and second modulations are processing, respectively, the signal to be monitored and the reference signal to obtain a first modulated signal or a second modulated signal whose mean current is proportional, respectively, to the square of the effective current of the signal to be monitored or to the square of the effective current of the reference signal.

8. The method as claimed in claim 7, further comprising:
   monitoring a signal relating to a supply current for an electromagnetic valve actuator of a motor vehicle.

* * * * *